United States Patent [19]
Dougherty et al.

[11] 4,202,007
[45] May 6, 1980

[54] MULTI-LAYER DIELECTRIC PLANAR STRUCTURE HAVING AN INTERNAL CONDUCTOR PATTERN CHARACTERIZED WITH OPPOSITE TERMINATIONS DISPOSED AT A COMMON EDGE SURFACE OF THE LAYERS

[75] Inventors: William E. Dougherty, Wappingers Falls; Stuart E. Greer, Poughkeepsie, both of N.Y.

[73] Assignee: International Business Machines Corporation, Armonk, N.Y.

[21] Appl. No.: 918,213

[22] Filed: Jun. 23, 1978

[51] Int. Cl.² .................... H01L 39/02; H01L 23/48; H01L 29/44
[52] U.S. Cl. ........................................ 357/80; 357/68; 357/65; 357/70; 361/414; 361/415; 174/68.5
[58] Field of Search ...................... 357/65, 67, 68, 70, 357/73, 80; 361/414, 415; 174/68.5

[56] References Cited
U.S. PATENT DOCUMENTS

| | | | |
|---|---|---|---|
| 3,323,198 | 6/1967 | Shortes | 361/414 |
| 3,436,604 | 4/1969 | Hyltin et al. | 361/414 |
| 3,555,364 | 1/1971 | Matcovich | 357/80 |
| 3,605,063 | 9/1971 | Stewart | 361/414 |
| 3,746,932 | 7/1973 | Hogan et al. | 361/414 |
| 3,746,934 | 7/1973 | Stein | 361/414 |
| 3,746,973 | 7/1973 | McMahon | 357/75 |
| 3,795,845 | 3/1974 | Cass et al. | 357/68 |
| 3,876,822 | 4/1975 | Davy et al. | 361/414 |

OTHER PUBLICATIONS

RCA Technical Notes; by L. Balents; Hermetically Sealed Semiconductor Flip-Chip Assembly, No. 857, pp. 1 & 2, Feb. 11, 1970.
IBM Technical Disclosure Bulletin, vol. 15, No. 8, Jan. 1973, Replaceable Engineering Change Pad; by Simek, pp. 2575 and 2576.

*Primary Examiner*—Andrew J. James
*Attorney, Agent, or Firm*—Henry Powers

[57] ABSTRACT

The coating of a conductor pattern on dielectric green sheets to a common edge thereof with stacking or superimpositioning together of a plurality of sheets to enclose the conductor pattern followed by sintering, with the edge side of the fired body having the exposed end terminations becoming the actual face of the body on which a semiconductor device is mounted in electrical circuit connection to respective ones of the common end terminations of the conductor runs. The conductor runs are returned through the body to the active face of the body to position the opposite or distal ends of the conductors thereat, in an increased spaced relationship of the distal conductor terminations. For external connection, terminal pins may be embedded in the fired body for connection at adjacent and to the distal conductor termination, with the pins projecting therefrom.

4 Claims, 15 Drawing Figures

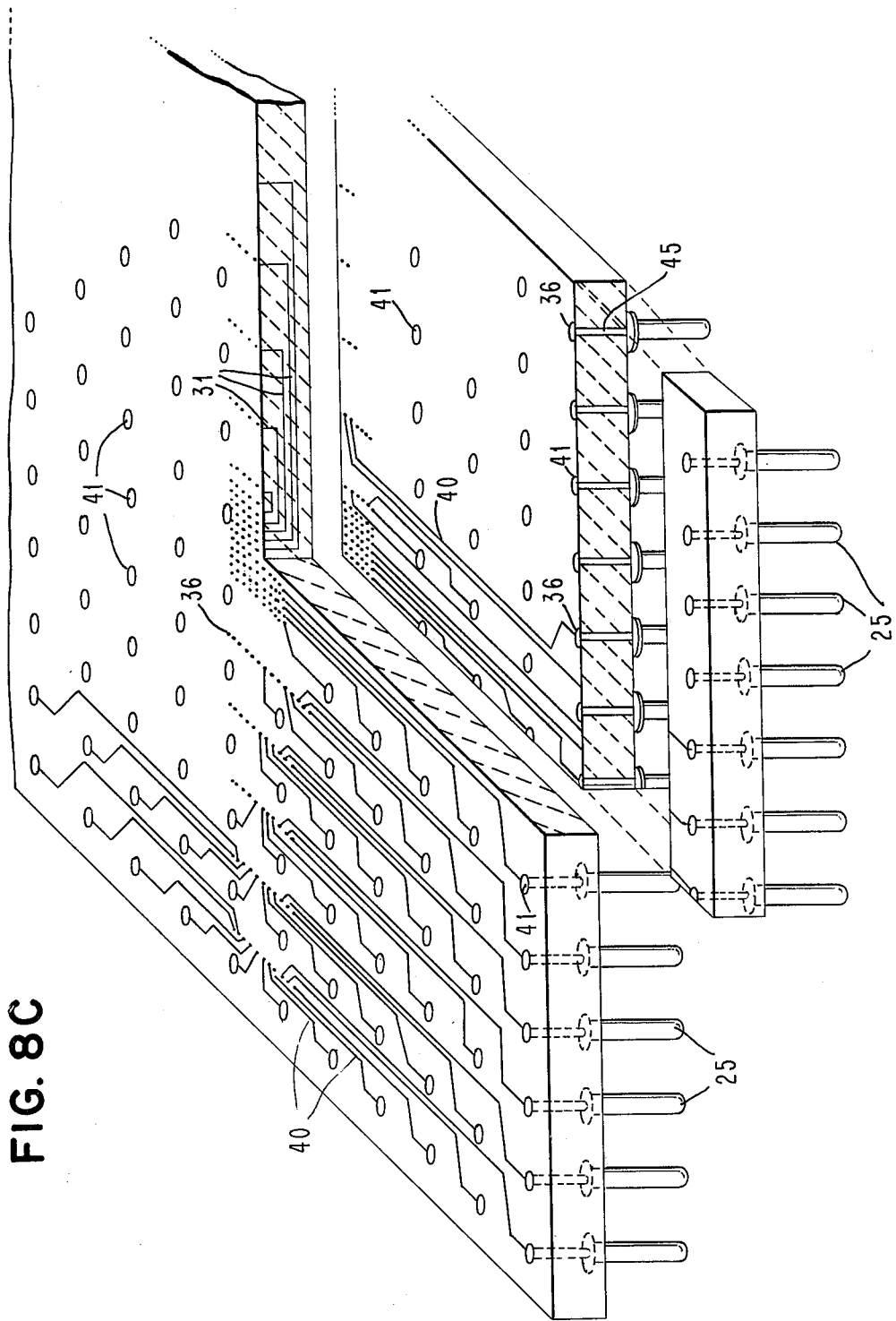

MULTI-LAYER DIELECTRIC PLANAR STRUCTURE HAVING AN INTERNAL CONDUCTOR PATTERN CHARACTERIZED WITH OPPOSITE TERMINATIONS DISPOSED AT A COMMON EDGE SURFACE OF THE LAYERS

DESCRIPTION

1. Technical Field

This invention relates to semiconductor device packaging art and, more particularly, to the packaging of miniaturized integrated circuit devices on multilayered dielectric substrates, including glass-ceramics, ceramics and the like.

Accordingly, one object of this invention is to provide a novel multilayered dielectric substrate for mounting thereon in electrical connection, to an embedded conductor circuit, at least one semiconductor device.

Another object of this invention is to provide a multilayer dielectric module to support in electrical connection, to an embedded circuit pattern, integrated circuit devices of increased density with a corresponding increased density of contact pads on a surface thereof.

Another object of this invention is to provide a multilayer circuit structure support, for integrated circuit devices, in which embedded conductor runs have common terminations exposed at one end surface of the structure and with the opposite conductor ends terminating in increased spaced relationship to each other at the same or another face or end surface of the structure.

Another object of this invention is to provide in a multi-layer dielectric structure a novel embedded conductor circuit having termination at a common surface thereof for electrical connection to mounted integrated circuit devices.

Another object of this invention is to provide in a vialess multi-layer dielectric substrate a novel conductor array for connection to mounted integrated circuit devices.

Another object of this invention is to provide a metallized interconnected pattern for multi-layer or stacked dielectric green sheets to form an integrated fired structure for electrical connection to mounted integrated circuit devices of increased density.

2. Background Art

As the integrated circuit technology advances towards large-scale integration and high performance circuits, it becomes necessary to provide interconnection electrical packaging which is compatible with the performance demands of the associated circuitry. In efforts to achieve more complex (e.g. dense) circuits, one approach has been to use multi-level glass-ceramic or ceramic microelectronic structure, which comprise composite dielectric bodies having electrically connected conductive patterns that may exist at a plurality of distinct horizontal levels.

A common method for fabricating such multi-level dielectric structures involves formulating ceramic or glass-ceramic particles into a paint with binder and solvent; forming the paint into a slip with conversion by evaporation of the solvent into a flexible sheet of required size, referred to as a green sheet; forming terminal holes and via holes as predetermined locations in separate sheets; depositing electrode paste on desired areas of the separate sheets once in the via holes; stacking or superimposing the sheets one on the other in required registration; and firing the stacked sheets to burn out the binder and to sinter the dielectric particles and to convert the paste into conductors, which results in a monolithic structure. At an appropriate point in the fabrication process, contact pins are embedded in the terminal holes for establishing an electrical path from these conductors to external circuitry. More extensive details as to such fabrication process can be found in U.S. Pat. Nos. 3,518,756 and 3,988,405, as well as in the article "A Fabrication Technique For Multi-Layer Ceramic Modules" by H D. Kaiser et al., Solid State Technology, May 1972, pp. 35–40 and in the article "The Third Dimension in Thick-Films Multilayer Technology" by W. L. Clough, Microelectronics, Vol. 13, No. 9 (1970), pp. 23–30.

Although the foregoing technique has found extensive acceptance in the art, it is nevertheless characterized with limitations with continuing increase in the densities of integrated circuits. This situation requires increased complexity of the internal metallurgical patterns embedded in the multi-layer dielectric substrate or module with respect to the number of conductor layers required, together with the number of interconnecting via holes and associated increased number of terminal pads required for electrical connection to the corresponding increased number of contact points on the active surface of an integrated circuit device. Also, such structures are characterized with via bulges which detract from the planarity of the structure.

BRIEF DESCRIPTION OF THE DRAWINGS

In the accompanying drawings forming a material part of this application:

FIGS. 8A to 8C are perspective views of additional embodiments of this invention.

DISCLOSURE OF THE INVENTION

Figure 1:
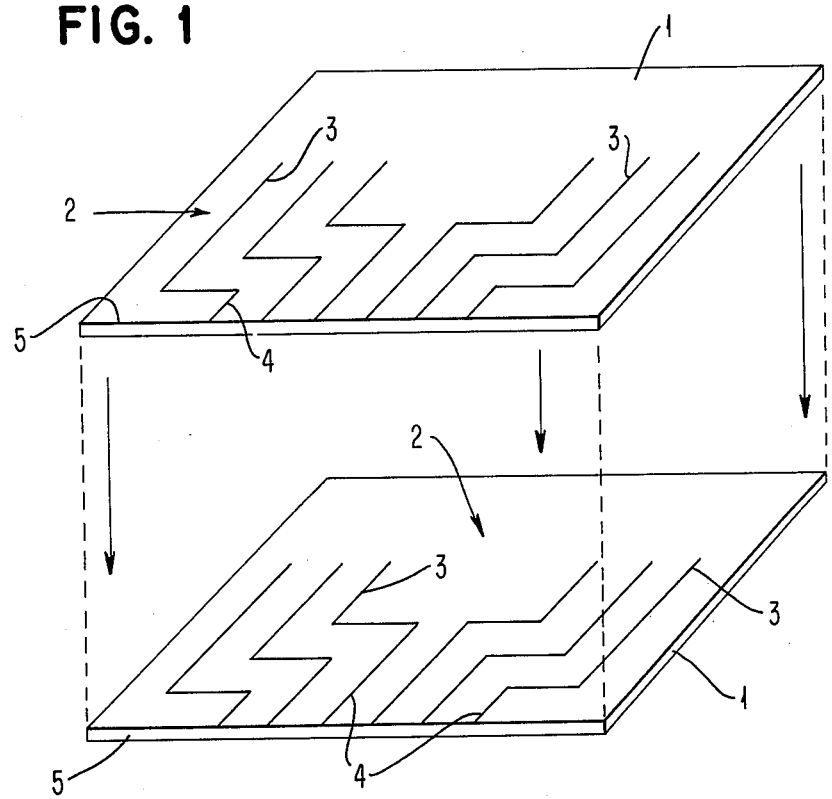
FIG. 1 is an isometric drawing illustrating the superimpositioning of dielectric green sheets carrying a conductor pattern in accordance with a structure to which the improvement of this invention is directed.

Referring to FIG. 1, the fabrication of the multi-layer structure begins with the preparation of a plurality of dielectric green sheets 1 into a form suitable for metallization. As is well known in the art, the preparation of dielectric green sheets involves the mixing of finely divided particles of glass, glass-ceramic or ceramics and other chemical additives such as organic solvents and binders which are then cast into slips, which upon evaporation of solvent, form pliant green sheets. Until these sheets and the particulates within them are sintered together by firing, they are termed green sheets.

For fabrication of multi-layer green sheet structures, a embryonic conductor pattern 2 of this invention is coated on the green sheets by any of the well known additive or subtractive processes. For example, the pattern can be formed by evaporating a blanket layer of a conductive metal on the green sheet followed by delineation of the desired pattern by photolithographic techniques. Alternately, the pattern can be applied or coated on required ones of the green sheets by screen printing of an electrode paste or ink which, on firing, are converted into a corresponding pattern of conductors (see for example U.S. Pat. No. 3,456,158 as to details of forming such conductor patterns).

Figure 4A:
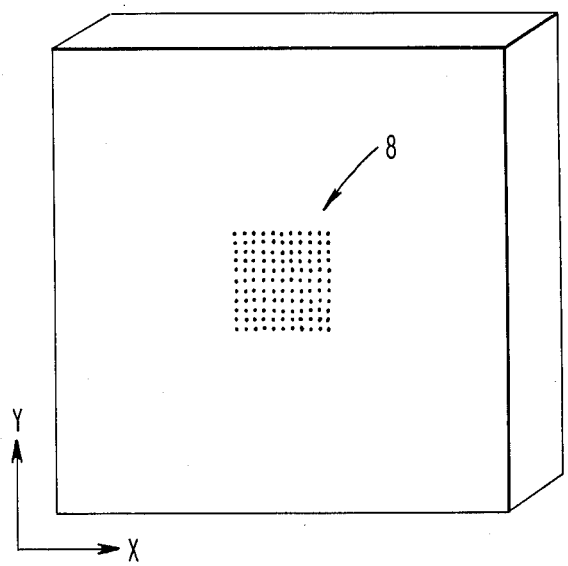
FIGS. 4A to 4E are detail views of fired dielectric structures illustrating various embodiments for adaptation of the structure for various applications.
Figure 4B:
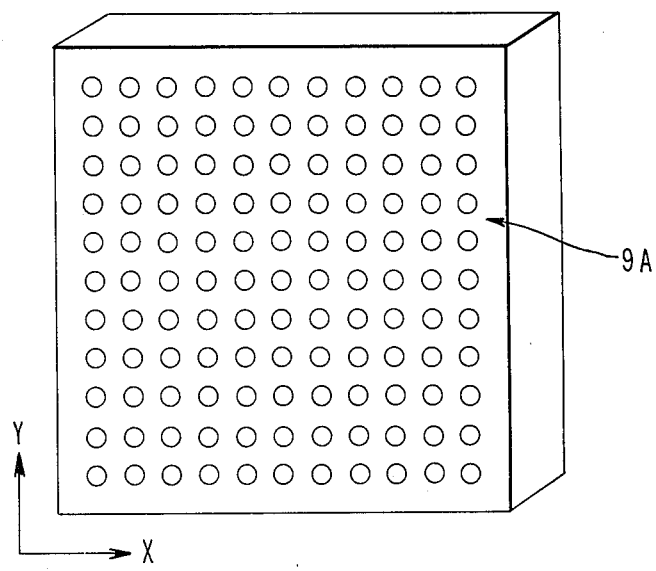
Figure 6:
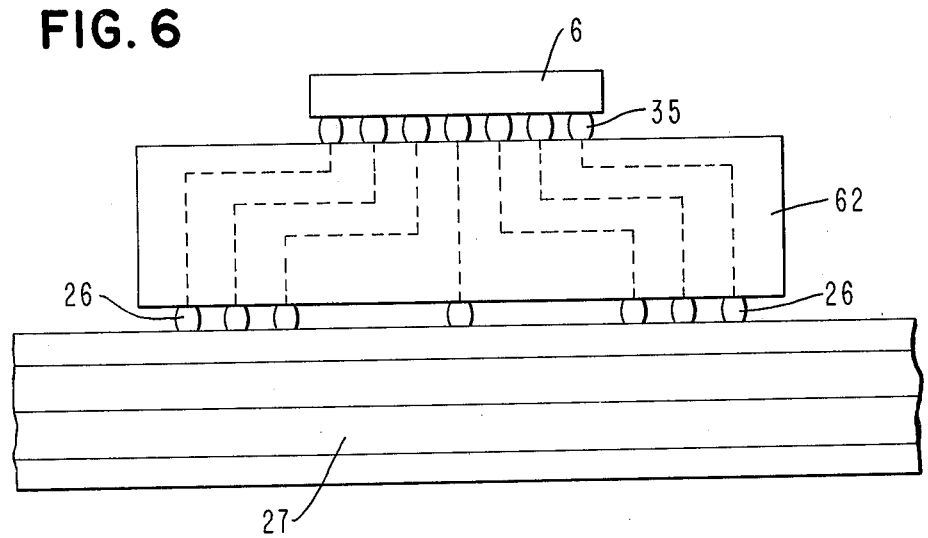
FIG. 6 is an elevational view illustrating one use of the structure of FIG. 4 in the semiconductor art.

The conductor pattern 2 comprises a plurality of conductor runs 3 which have adjacent end portions 4 terminating at an edge 5 of the green sheets, where they will form contact points on an input grid 8 (see FIG. 4A) corresponding to or mating with respective contact areas on the surface of an integrated circuit chip 6 (see FIG. 6). Each of conductor runs or leads 3 (as set forth in co-pending application Ser. No. 918,214, filed June 23, 1978, now U.S. Pat. No. 4,193,082, issued Mar. 11, 1980, to dispose adjacent opposite ends on an increased output grid 9 (see FIG. 4B) spacing along a cut line 7 which will define the opposite edge surface 61 of the green sheet.

Figure 2:
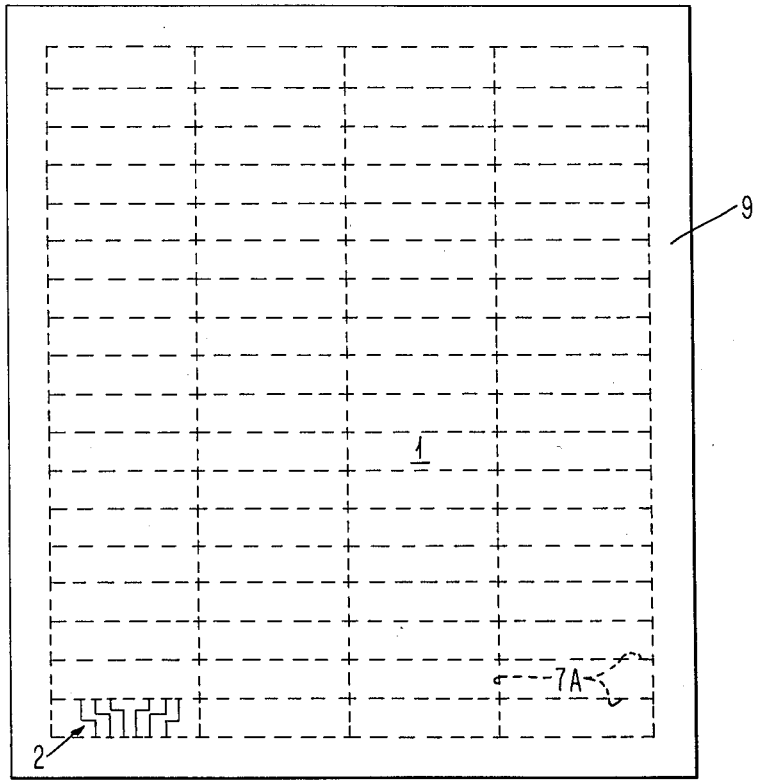
FIG. 2 is a plan view showing the manner of disposition of multi-conductor patterns on a mother green sheet.

As shown in FIG. 2, the green sheets can be formed from a mother green sheet 9, wherein a plurality of conductor patterns 2 can be simultaneously applied for throughput purposes. The individual green sheets 1 are obtained by severing them along cut lines 7A along the mother sheet 9, preferably after lamination.

The grid spacing, both input and output, are indicated as extending in orthogonal X-Y directions. The grid spacing in the X orthogonal direction can be defined by appropriate patterning of the conductor runs 3 on the surface of green sheets 1. The grid spacing in the Y orthogonal direction can be obtained in various manners. For example, the green sheets can be formed of varied thicknesses corresponding to the Y grid spacing desired. Alternatively, the multi-layer structure can be obtained from green sheets of the same thicknesses which will include blank sheets which will serve as spacers between conductor screened sheets in accordance with the spacing requirements. For example, the input grid 8 may be formed with its contact points on 0.006 inches which can fan out to the output grid 9 defining terminal points on a 0.010 to 0.125 inches spacing.

Figure 3B:
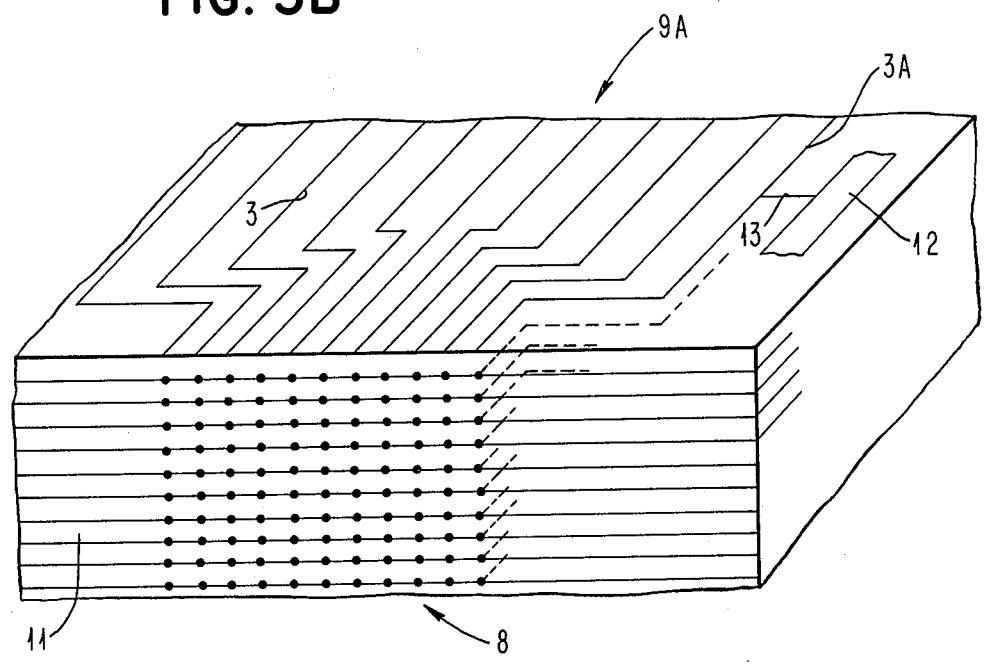
Figure 4C:
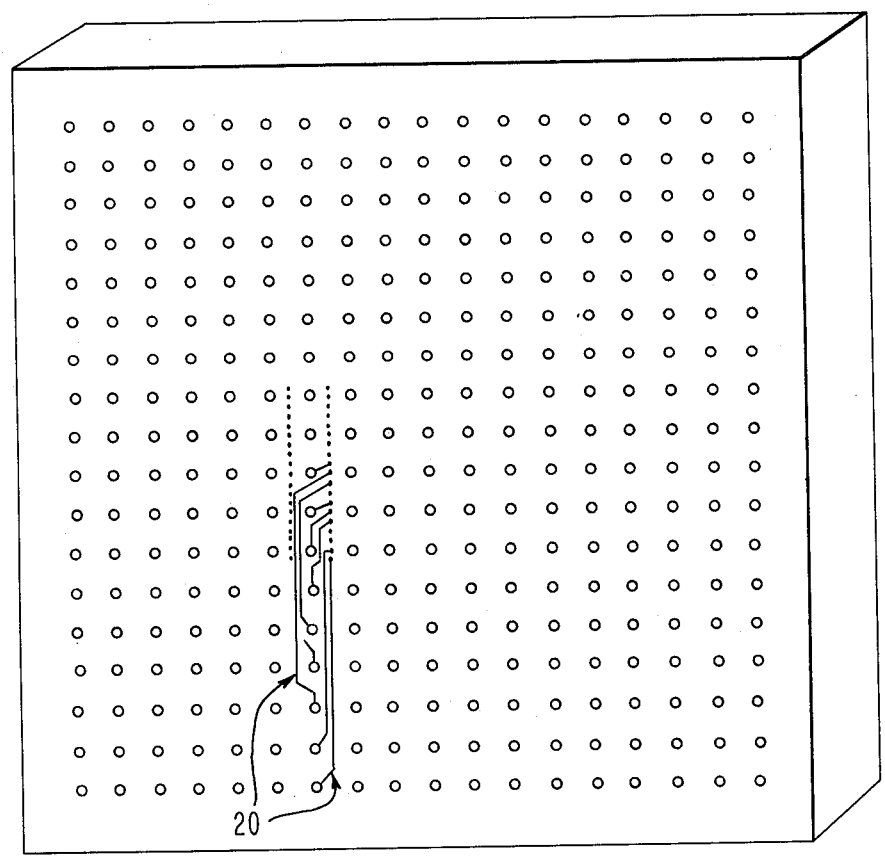
Figure 4E:
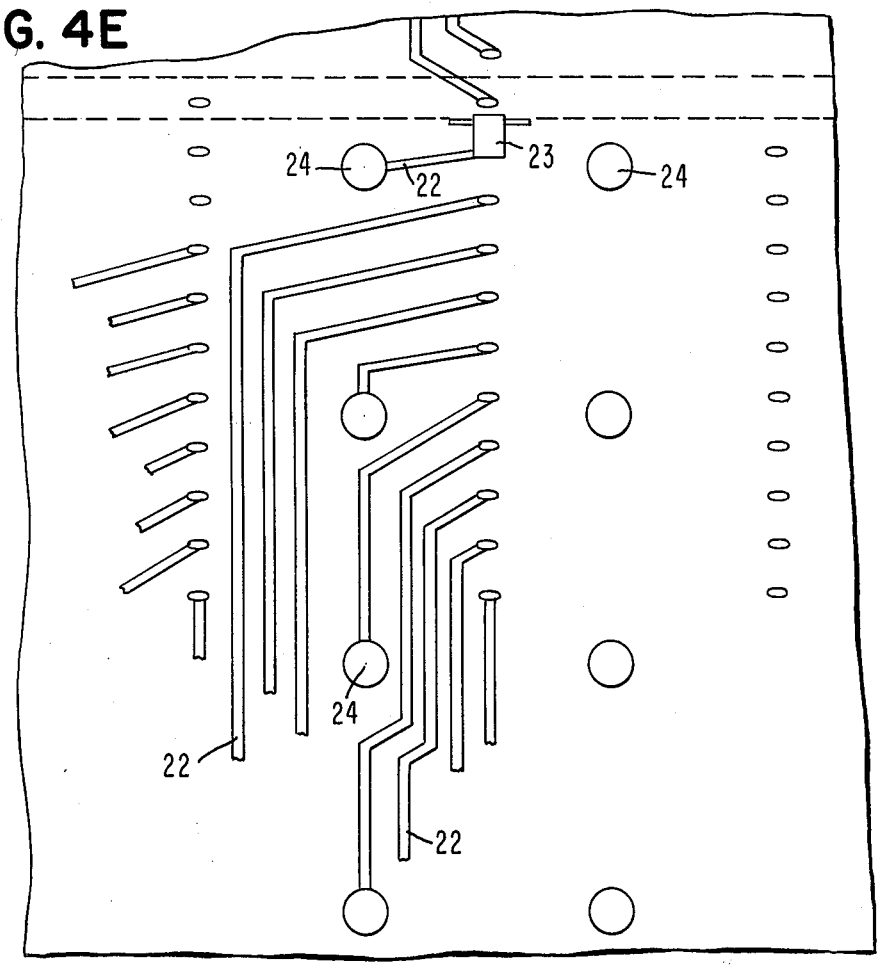
Figure 4D:
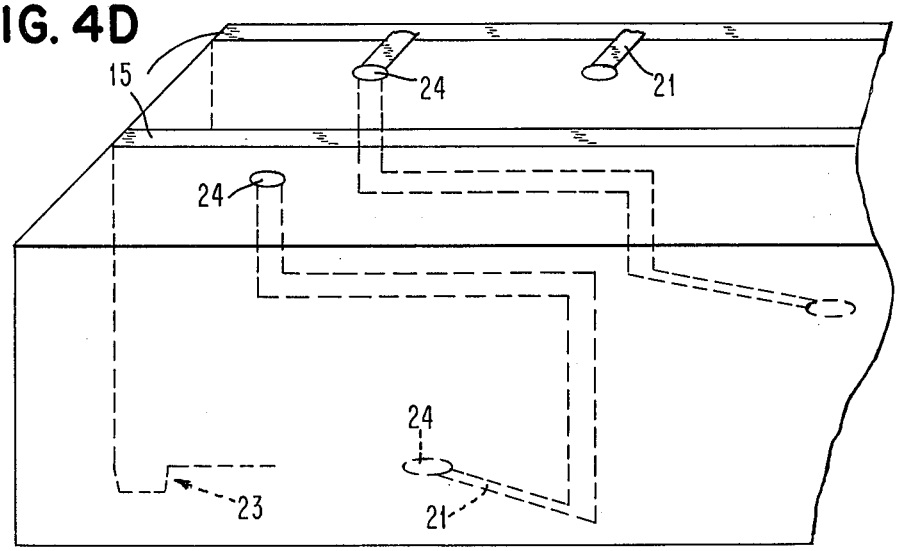

By appropriate patterning of the conductor runs and use of blank green sheets 60, the input edge surface 11, or the output surface 11a, of the multi-layer structure (see FIG. 5), can be provided with sufficient blank spacers to accommodate the incorporation of other electrical elements such as resistors, capacitors and the like. Also, the metallurgy can include ground planes, voltage distribution planes and power planes 15 (see FIG. 4D) between blank portions of adjoining green sheets. Similarly, as shown in FIG. 3B, the conductor pattern on one or more of the green sheets can include transverse extensions 13 to accommodate metallurgy for a power bus 12. Also, it is to be understood, such green sheets can be comprised of varied dielectric materials, as desired, to increase the electrical characteristics of the structure.

Where the layers of completely metallized green sheets (e.g. 15) are interleaved between successive plies of conductor patterned sheets, a series of biplates can be formed. These plates can be positioned on either side of the conductor pattern, creating an electrical strip line configuration which, when electrically biased, become equivalent capacitor plates. These bi-plates (e.g. 15) perform several functions: (a) they provide for a reduction in coupled noise (cross-talk) generated at active signal conductors; (b) they fix the impedance of the signal conductors; and (c) they provide sites to physically and electrically connect power I/Os in parallel, near the chip, to reduce the inductance associated with power distribution, and in turn reduce the "delta i" noise caused when a circuit is activated. The voltage to these bi-plates can be arranged to optimize electrical function and physical arrangement of the chip and carrier.

Also, such conductor bi-plates (e.g. similar to 15) can be joined in appropriate manner so that their capacitance can provide a decoupling or filtering function. Also, the bi-plates can be positioned away from the signal conductors in areas that are normally not used for electrical functions (e.g. FIG. 4D).

Other suitable materials (e.g. resistor paste) can be applied to the green sheet (or after firing) that can provide resistor capability within the carrier, for such functions as terminating resistors. Inductors can be similarly formed.

The faces of the carrier, after severing along cut lines 7, can be used to provide a surface upon which interconnecting metallurgy 20, 21 and 22 (see FIGS. 4C, 4D and 4E) can be applied. The finish of the faces can be enhanced by polishing, or by appropriate coatings, providing a surface smooth enough for lithographic processing. Conductor tabs 23 (FIG. 4D) can be incorporated to allow for carrier thickness variability, contact points and connectors.

Figure 8A:
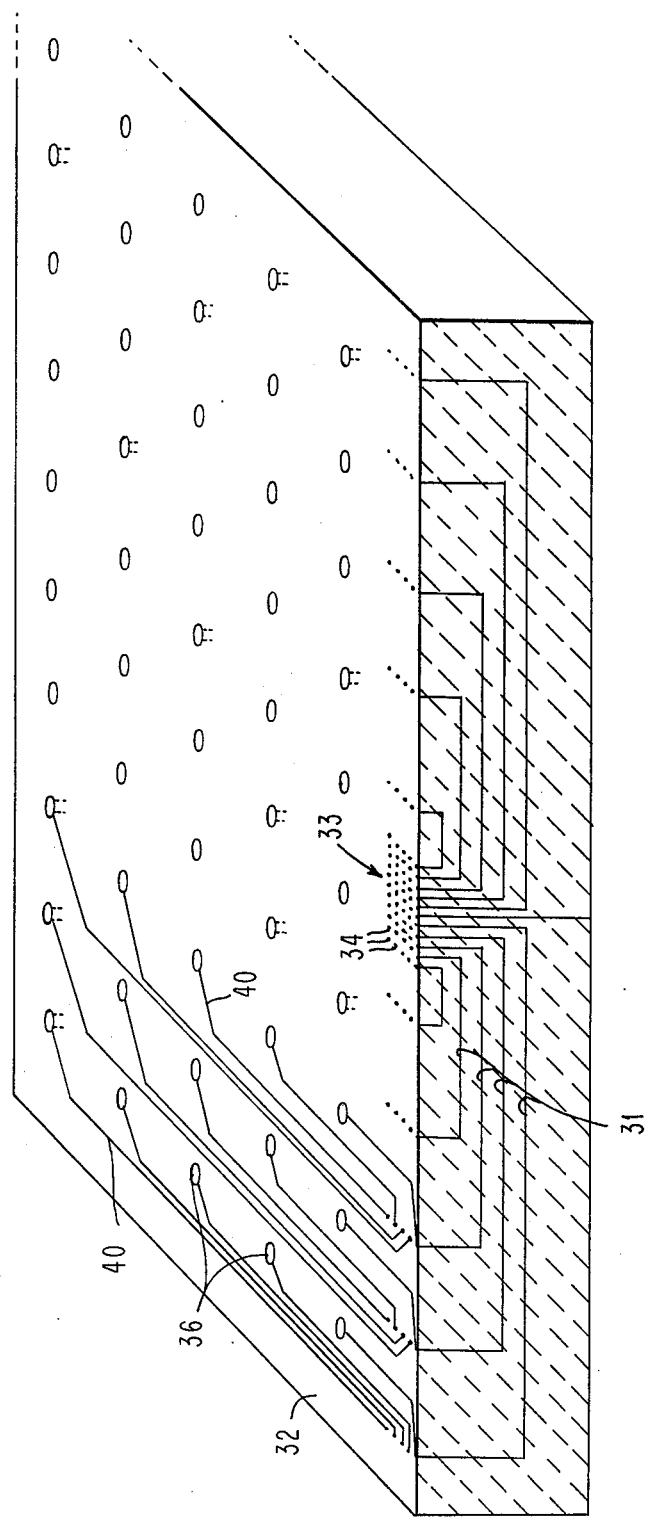
Figure 8B:
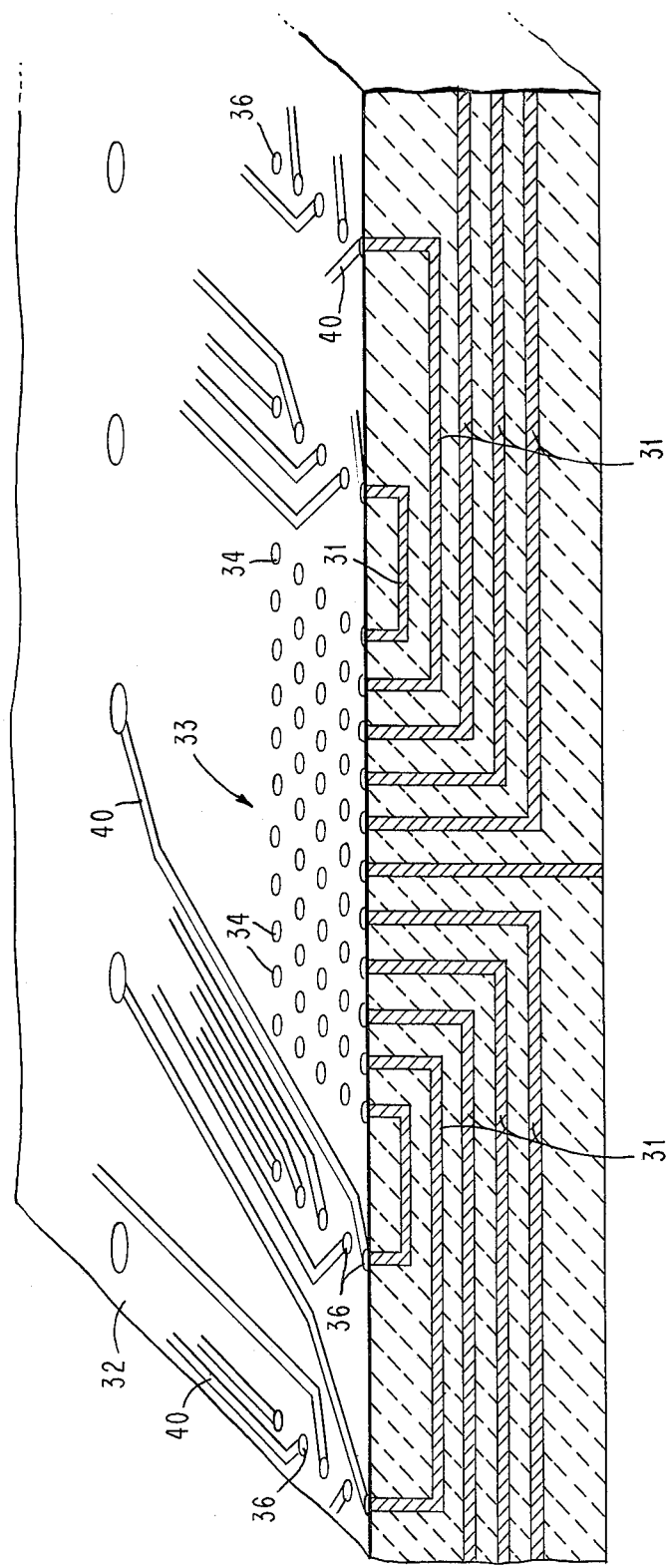

Input/output pad metallization 24 can be provided on the faces of the carrier to allow electrical interconnecting to other packaging components. These input/output structures can comprise contact pins or jacks 25 (FIG. 8C), solder pads 26 (for flip chip joining, FIG. 6), or other conducting materials. Placing the chip carrier in close proximity with the next layer 27 (FIG. 6) of packaging to reduce inductance is one way of taking advantage of the flip chip bonding type connection. A low expansivity matched card or board, e.g. 27, (i.e. Kevlar-based, low expansivity ceramic) can be used to carry many of the multi-layered carriers of this invention.

Figure 3A:
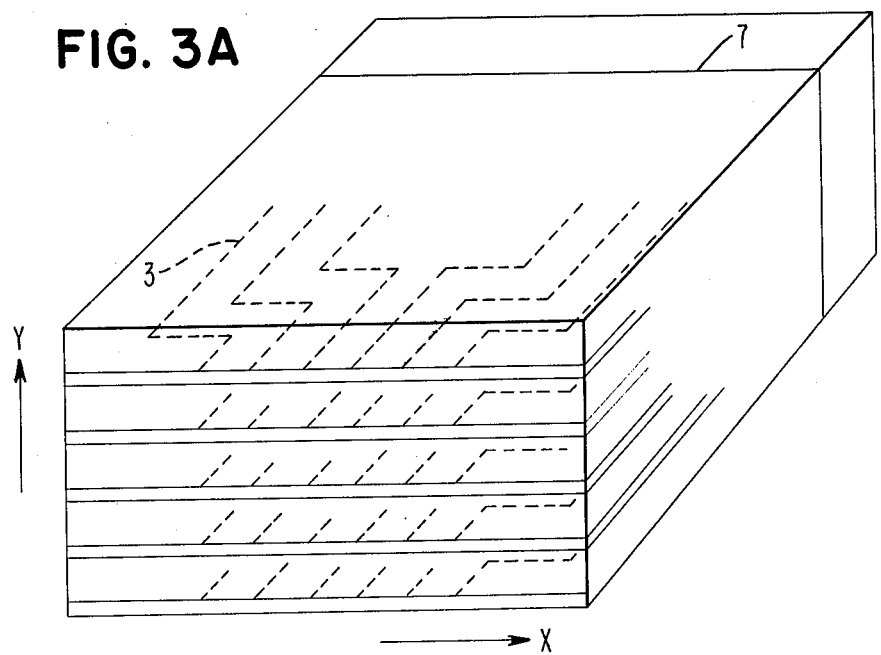
FIGS. 3A and 3B are detail views of a stacked green sheet assembly.
Figure 5:
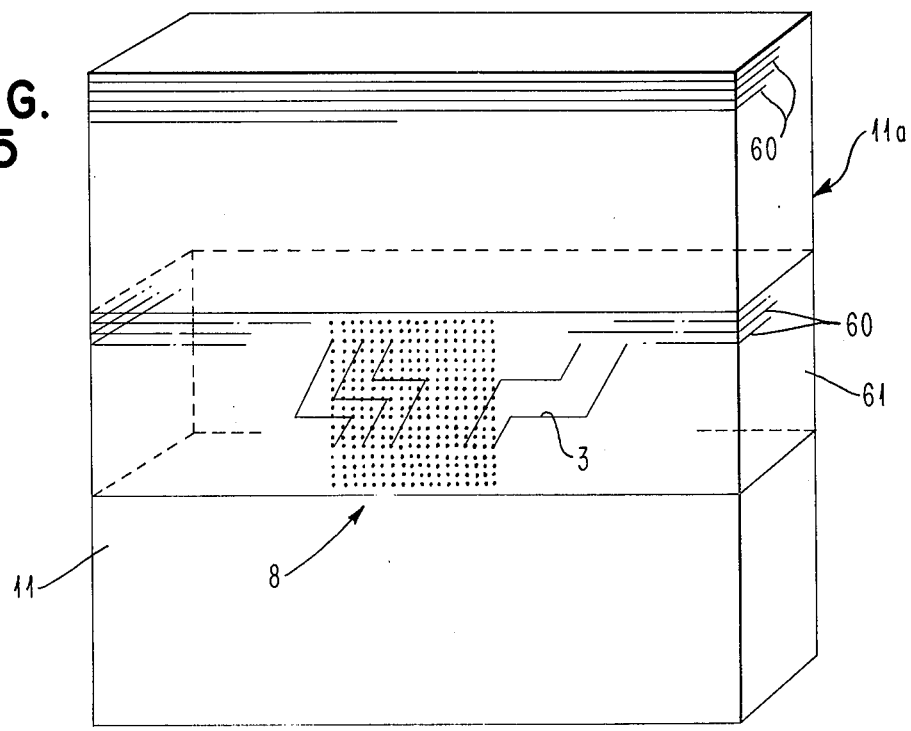
FIG. 5 is a perspective view of another embodiment of the structure of FIG. 1.

A plurality of the prepared green sheets are superimposed on each other in a stacked relation (e.g. FIGS. 3A and 5). The assembly can then be placed in a press which applies sufficient pressure to the stack to form a bond between adjacent green sheets. The thermoplastic nature of the binder in the green sheets causes the various layers to adhere to one another and produce a unitary body. If desired, individualized carriers of chips can be cut from the mother block, if mother green sheets 9 were employed. Also, the laminated stack may be provided with full or partial through-holes or apertures for pinning operations, as well as additional metallization, such as redistribution pattern 20, 21 and 22.

In any event, the laminated green sheets are inserted into a sintering oven for firing in which the binder is driven off, normally be decomposition, followed by sintering or unification of the dielectric particles in accordance with well established techniques into a unified structure 62.

Figure 7:
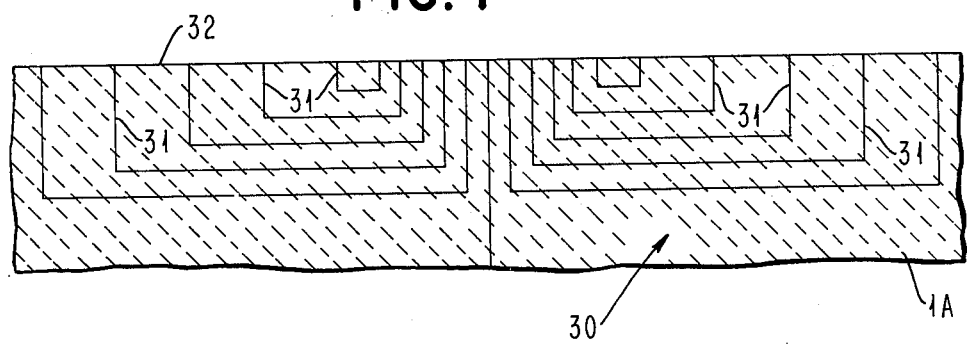
FIG. 7 is an elevational view illustrating an embodiment of an embedded conductor pattern in accordance with this invention.

FIG. 7 illustrates an embodiment of this invention in which a conductor pattern 30 is applied on a green sheet 1A in a return path where the ends of the individual conductor runs 31 terminate at the same edge or chip side 32 of the green sheet. As in the preceding embodiment, the input terminations 34 are arranged in a grid 34 to make respective ones of a dense array of contact areas 35, e.g. solder mounds, disposed in register with contact areas, on the surface of an integrated circuit chip or device 6. In both embodiments, the chip 6 is flip chip bonded to the conductor input termination, e.g. 34, by well known practices such as solder reflow or other eutectic metal attachment.

The conductor runs 31, from each input termination 34, are fanned out in the return path to the chip side edge 32 to provide output terminations 36 on a substantially enlarged lateral spacing relative to each other. Also, the required orthogonal spacing between the termination can be obtained by interleaving of blank green sheets.

The prepared green sheets are then stacked one on the other and bonded under pressure into a laminate. At this point, redistribution wiring 40 can be metallized on the chip side face of the laminate between the output terminations 36 to exit points 41 on a further increased grid spacing. It is to be understood that the redistribution wiring 40 can be applied before or after firing of the laminate.

In order to extend the circuit from the chip side of the laminate to its back side, appropriate conductive via lines 45 can be coated on the green sheets disposed at exit points 41. Alternatively, via holes (extending from the chip side to the back side of the carrier) can be punched through the laminate for insertion of contact pins 25, after firing.

In any event, the green sheet laminate is then fired at temperatures sufficient for binder burn out and sintering or unification of the dielectric particulates. At this point, if the redistribution lines 40 have not been employed, the front and back sides can be suitably polished for photolithographic or other means of forming the redistribution lines on the fired structure. The structure can be completed by adding the contact pins 25 either in extension to formed via holes to the exit points 41, or to the back side terminations of via lines 45.

While the invention has been illustrated and described in reference to preferred embodiments thereof, it is to be understood that the invention is not limited to the precise constructions herein disclosed and the right is reserved to all changes and modifications coming within the scope of the invention as defined in the appended claims.

Having thus described the invention, what is claimed as new, and desired to be secured by Letters Patent is:

1. A planar support for attachment to at least one semiconductor device having a plurality of terminals fixed thereon and arranged in a first grid pattern upon one side of the device, comprising
   (A) a unitized plurality of superposed dielectric planar layers,
   (B) a conductor pattern comprised of a plurality of conductor leads between at least one original adjacent pair of said layers and extending in a return path to and between a common edge surface of said layers,
      (a) with said conductor leads substantially coextensive and parallel with the planes of said layers,
      (b) with said edge surfaces disposed at the ends of the original interfaces of said layers,
      (c) with the common adjacent terminations of said leads disposed at a first portion of said edge surface in a configuration corresponding to a first grid pattern of predetermined spacing, and
      (d) with the opposite common terminations of said leads disposed at a second portion of said edge surface in a second grid pattern having spacings substantially larger than said first spacing,
   (C) a distribution pattern of conductors on said edge surface and comprised of a plurality of leads having one end connected to respective ones of opposite terminations with the opposite ends terminating at dispersed contact points on a third portion of said edge surface with the spacing between said points being substantially greater than the spacing of both said first and second grid patterns, and
   (D) contact pins extending from said contact points to the opposite edge surface of said layers in projecting relationship therefrom, with said contact pins coextending with and parallel with the planes of said layers and conductor pattern.

2. The support as in claim 1 including a semiconductor device mounted on the first said edge surface with terminals of said device electrically connected to respective ones of said terminations in said first grid pattern, said device mounted along lines coextensive and parallel with said interfaces of said layers.

3. The structure as in claims 1 and 2 wherein said dielectric comprises a ceramic material.

4. The structure as in claims 1 and 2 wherein said dielectric comprises a glass-ceramic material.

* * * * *